US011152724B2

(12) United States Patent
Hung

(10) Patent No.: US 11,152,724 B2
(45) Date of Patent: Oct. 19, 2021

(54) ELECTRICAL CONNECTOR AND CONNECTOR ASSEMBLY THEREOF

(71) Applicant: Dongguan Luxshare Technologies Co., Ltd, Dongguan (CN)

(72) Inventor: Yung-Chih Hung, Dongguan (CN)

(73) Assignee: DONGGUAN LUXSHARE TECHNOLOGIES CO., LTD., Dongguan (CN)

( * ) Notice: Subject to any disclaimer, the term of this patent is extended or adjusted under 35 U.S.C. 154(b) by 0 days.

(21) Appl. No.: 16/864,747

(22) Filed: May 1, 2020

(65) Prior Publication Data

US 2020/0259280 A1    Aug. 13, 2020

(30) Foreign Application Priority Data

Nov. 4, 2019   (TW) .................................. 108139983

(51) Int. Cl.
*H01R 12/70*    (2011.01)
*H01R 13/40*    (2006.01)
*H01R 13/514*   (2006.01)
*H01R 13/627*   (2006.01)
(Continued)

(52) U.S. Cl.
CPC ......... *H01R 12/7005* (2013.01); *H01R 13/11* (2013.01); *H01R 13/40* (2013.01); *H01R 13/514* (2013.01); *H01R 13/627* (2013.01); *H05K 3/301* (2013.01); *H05K 3/306* (2013.01); H05K 2201/10189 (2013.01); H05K 2201/10431 (2013.01)

(58) Field of Classification Search
CPC .... H01R 12/7005; H01R 13/11; H01R 13/40; H01R 13/514; H05K 3/301; H05K 3/306
USPC ......................................................... 439/296
See application file for complete search history.

(56) References Cited

U.S. PATENT DOCUMENTS 4,768,961 A * 9/1988 Lau ........................ H01R 24/58
439/61
5,378,159 A * 1/1995 Renn .................... H01R 12/716
439/377

(Continued)

FOREIGN PATENT DOCUMENTS

CN          1682414 B      5/2010
CN        203747183 U      7/2014
(Continued)

*Primary Examiner* — Alexander Gilman
(74) *Attorney, Agent, or Firm* — Birch, Stewart, Kolasch & Birch, LLP

(57) ABSTRACT

An electrical connector includes an insulation body, a seat, and a positioning plug. The seat is disposed on an outer peripheral surface of the insulation body. The seat includes a tunnel defined through the seat to form an inlet and an outlet. The outlet and a front surface of the insulation body face the same side. The seat further includes a slit and one or more first bumps disposed on an inner wall of the slit. The positioning plug includes a sliding block and rib. The sliding block movably disposed in the tunnel via the inlet with the rib movably disposed in the slit. The positioning plug further includes a second bump disposed on a lateral side of the rib facing the first bump. When the sliding block moves to an installation position, the first bump stops the second bump to fix the sliding block at the installation position.

12 Claims, 12 Drawing Sheets

(51) Int. Cl.
*H05K 3/30* (2006.01)
*H01R 13/11* (2006.01)

(56) References Cited

U.S. PATENT DOCUMENTS

| | | | | |
|---|---|---|---|---|
| 7,744,408 | B2* | 6/2010 | Komatsu | H01R 12/707 |
| | | | | 439/567 |
| 8,323,049 | B2* | 12/2012 | Ngo | H01R 13/514 |
| | | | | 439/552 |
| 8,794,991 | B2* | 8/2014 | Ngo | H01R 12/75 |
| | | | | 439/350 |
| 8,942,007 | B2* | 1/2015 | Takamura | H01R 12/58 |
| | | | | 361/801 |
| 9,837,742 | B2* | 12/2017 | Lee | H01R 12/55 |
| 2011/0003495 | A1* | 1/2011 | Kuo | H01R 13/6272 |
| | | | | 439/155 |
| 2018/0175571 | A1* | 6/2018 | Choo | H01R 13/514 |
| 2019/0249854 | A1* | 8/2019 | Shen | F21V 23/0435 |

FOREIGN PATENT DOCUMENTS

| | | |
|---|---|---|
| CN | 102301537 B | 8/2014 |
| CN | 206283014 U | 6/2017 |
| CN | 206283046 U | 6/2017 |
| CN | 206806561 U | 12/2017 |
| CN | 206908021 U | 1/2018 |
| CN | 207265268 U | 4/2018 |

* cited by examiner

ELECTRICAL CONNECTOR AND CONNECTOR ASSEMBLY THEREOF

CROSS-REFERENCE TO RELATED APPLICATION

This non-provisional application claims priority under 35 U.S.C. § 119(a) to Patent Application No. 108139983 in Taiwan, R.O.C. on Nov. 4, 2019, the entire contents of which are hereby incorporated by reference.

BACKGROUND

Technical Field

This disclosure relates to an electrical connector and a connector assembly, in particular, to an electrical connector and a connector assembly which can be installed rapidly.

Related Art

When an electrical connector is installed on an electronic device, the electrical connector is fixed on the back plate of a chassis, and the electrical connector is exposed on the back plate through an installation hole for the connection of an external electrical connector. Beside the installation hole corresponding to the electrical connector, the back plate further has one or more fixing holes arranged near the installation hole. The fixing holes allow fixing members, such as pins or screws, passing therethrough, thereby connecting to the electrical connector. Hence, the electrical connector is fixed on the back plate.

The pins and the screws mentioned above are independent small components, which are easy to fall and lose. Moreover, these small components have to be used along with tools. It is also understood that as these small components have their own specifications, pins and screws with correct specifications should be used for the installation of the electrical connector. Therefore, the installation of the electrical connector becomes a complicated and time-consuming work, thereby affecting the productivity of electronic devices including the electrical connector.

SUMMARY

In order to solve the problem for positioning the electrical connector, this disclosure discloses an electrical connector, so that the electrical connector can be rapidly installed on the back plate to form a connector assembly without tools.

An electrical connector according to this disclosure comprises an insulation body, a seat, and a positioning plug. The insulation body includes a front surface, a rear surface, and an outer peripheral surface. The front surface and the rear surface are correspondingly configured along an installation direction, and the outer peripheral surface is connected to an edge of the front surface and an edge of the rear surface. The seat is disposed on the outer peripheral surface. The seat includes a tunnel, the tunnel is defined through the seat along a direction parallel to the installation direction to form an inlet and an outlet, and the outlet and the front surface face the same side. The seat further includes a slit and at least one first bump, the slit is extending in a direction parallel to the installation direction, the slit communicates with the tunnel, and the at least one first bump is disposed on an inner wall of the slit. The positioning plug includes a sliding block and a rib. The rib is connected to the sliding block. The sliding block is movably disposed in the tunnel via the inlet, so that the rib is movably disposed in the slit. The positioning plug further includes at least one second bump, and the at least one second bump is disposed on a lateral side of the rib facing the at least one first bump. The sliding block moves between a released position and an installation position in the tunnel. When the sliding block is disposed at the installation position, the at least one first bump stops the at least one second bump to fix the sliding block at the installation position.

In at least one embodiment, the outlet includes a stepped segment with respect to the front surface, so that the front surface protrudes along the installation direction from a front end surface, where the outlet is disposed at the front end surface.

In at least one embodiment, the slit forms an opening at an edge of the inlet.

In at least one embodiment, when the sliding block is disposed at the installation position, the at least one first bump is located between the at least one second bump and the opening of the slit.

In at least one embodiment, when the sliding block is disposed at the released position, the at least one second bump is located between the at least one first bump and the opening of the slit.

In at least one embodiment, the seat further includes at least one deformable slot, and the at least one deformable slot is configured parallel to the slit.

In at least one embodiment, the seat further includes a positioning buckle in the tunnel, the sliding block further includes a positioning trough corresponding to the positioning buckle, the positioning buckle is engaged into the positioning trough, and the positioning buckle moves back-and-forth in the positioning trough.

In at least one embodiment, a length of the positioning trough is equal to or greater than a length from the released position to the installation position.

In at least one embodiment, the seat further includes at least one first guiding element, and the sliding block further includes at least one second guiding element. The at least one first guiding element is mated with the at least one second guiding element, so as to limit the sliding block moving between the released position and the installation position along a straight line.

In at least one embodiment, the at least one first guiding element is a guiding rail arranged in the tunnel, and the guiding rail extends from the inlet to the outlet. The at least one second guiding element is a guiding groove to receive the guiding rail, The guiding groove includes an open end and a closed end, and the open end faces the outlet.

In at least one embodiment, the electrical connector further includes at least one electrical terminal and at least one wire, wherein the electrical terminal is disposed in the insulation body, and the electrical terminal is connected to the wire at the rear surface.

A connector assembly according to this disclosure comprises an electrical connector as aforementioned and a back plate. The back plate includes an installation hole, and the installation hole allows the front surface and portions of the sliding block protruding from the outlet passing therethrough.

In at least one embodiment, the insulation body further includes at least one front positioning block and at least one rear positioning block. A clamping groove is defined between the at least one front positioning block and the at least one rear positioning block, a hypothetical clamping plane where the clamping groove is disposed is perpendicular to the installation direction, and the hypothetical clamping plane is between the front surface and the front end surface. The back plate further includes at least one notch, the at least one notch is formed at an edge of the installation hole, and the at least one notch allows the front positioning block passing therethrough.

In one or some embodiments of this disclosure, the electrical connector is provided with the positioning plug, so that the electrical connector can be rapidly positioned on the back plate without fixing elements such as screws, nuts, pins and other fixing components which may require tool assistances, thereby effectively simplifying and accelerating the assembly process.

BRIEF DESCRIPTION OF THE DRAWINGS

This disclosure will become more fully understood from the detailed description given herein below for illustration only, and thus not limitative of this disclosure, wherein.

DETAILED DESCRIPTION

Figure 1:
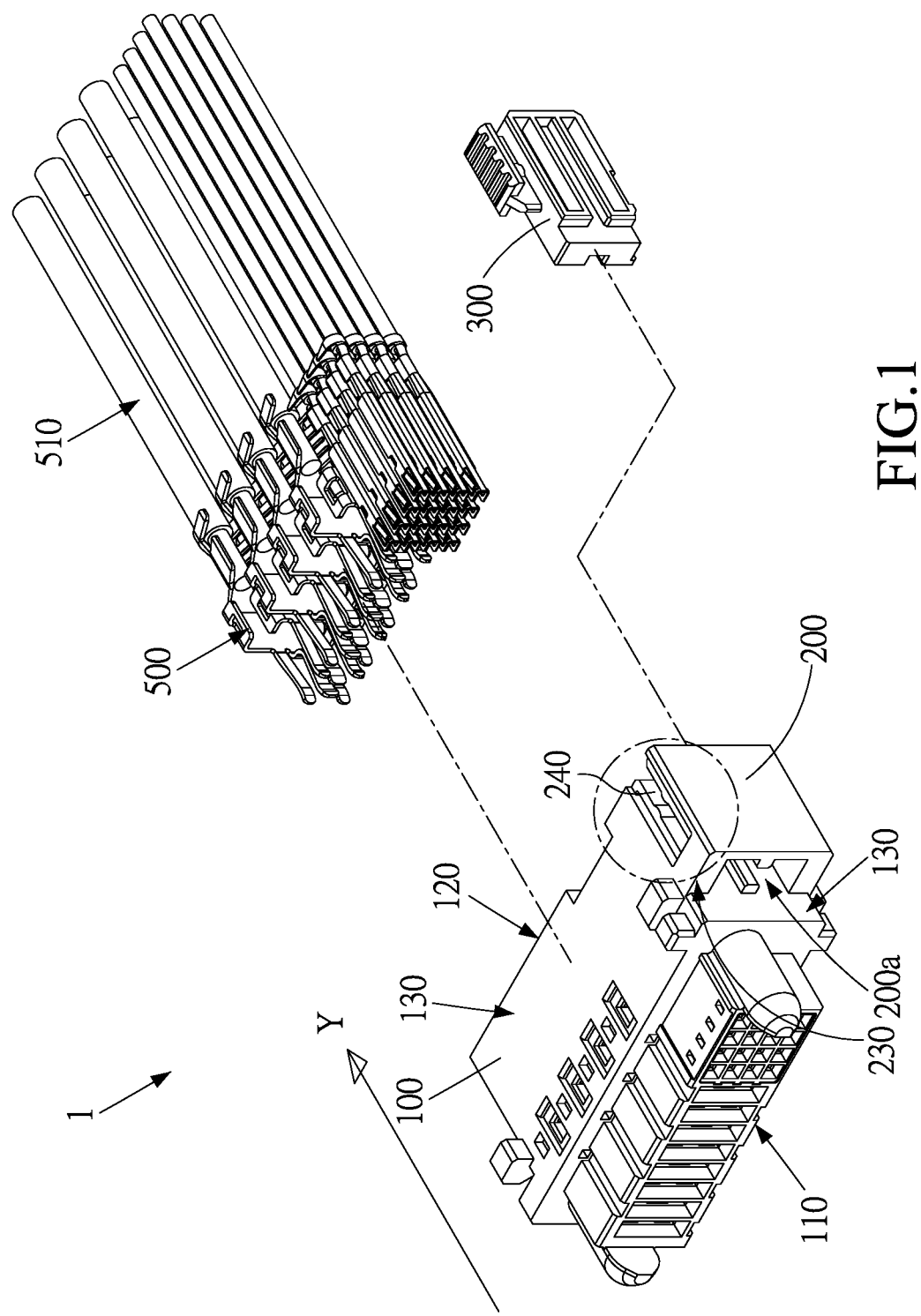
FIG. 1 illustrates an exploded view of an electrical connector according to a first embodiment of this disclosure.
Figure 2:
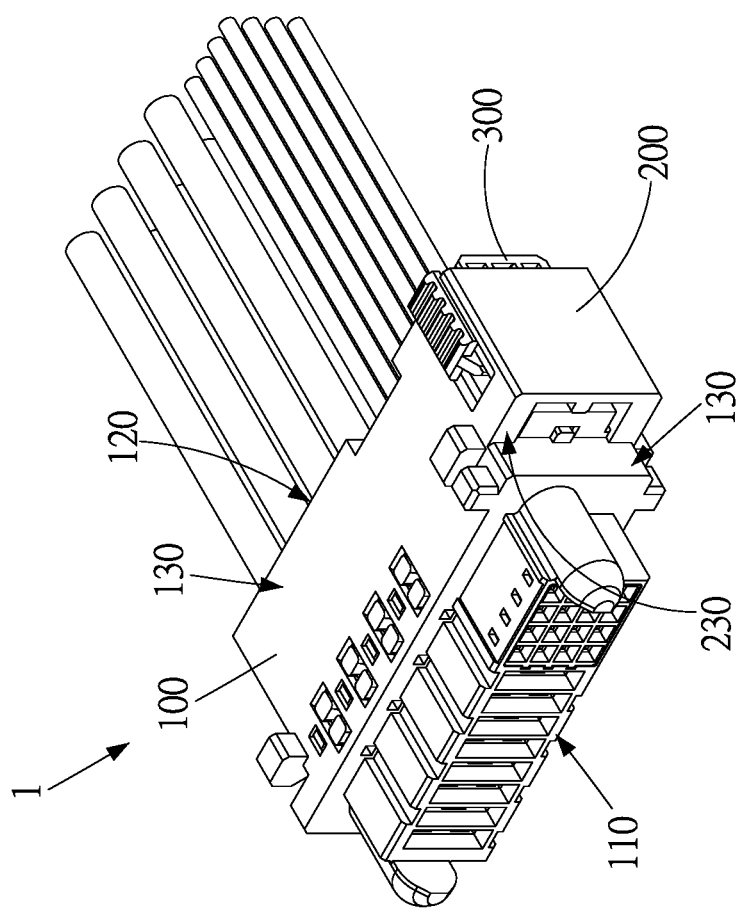
FIG. 2 illustrates a perspective view of the electrical connector of the first embodiment.

Please refer to FIGS. 1 and 2; an electrical connector 1 according to a first embodiment of this disclosure is illustrated. The electrical connector 1 comprises an insulation body 100, a seat 200, and a positioning plug 300.

As shown in FIGS. 1 and 2, the insulation body 100 includes a front surface 110, a rear surface 120, and an outer peripheral surface 130. The front surface 110 and the rear surface 120 are correspondingly configured along an installation direction Y, and the outer peripheral surface 130 is connected to an edge of the front surface 110 and an edge of the rear surface 120. The insulation body 100 allows an electrical terminal 500 to be disposed therein, and the electrical terminal 500 is connected to a wire 510 at the rear surface 120 of the insulation body 100.

Figure 3:
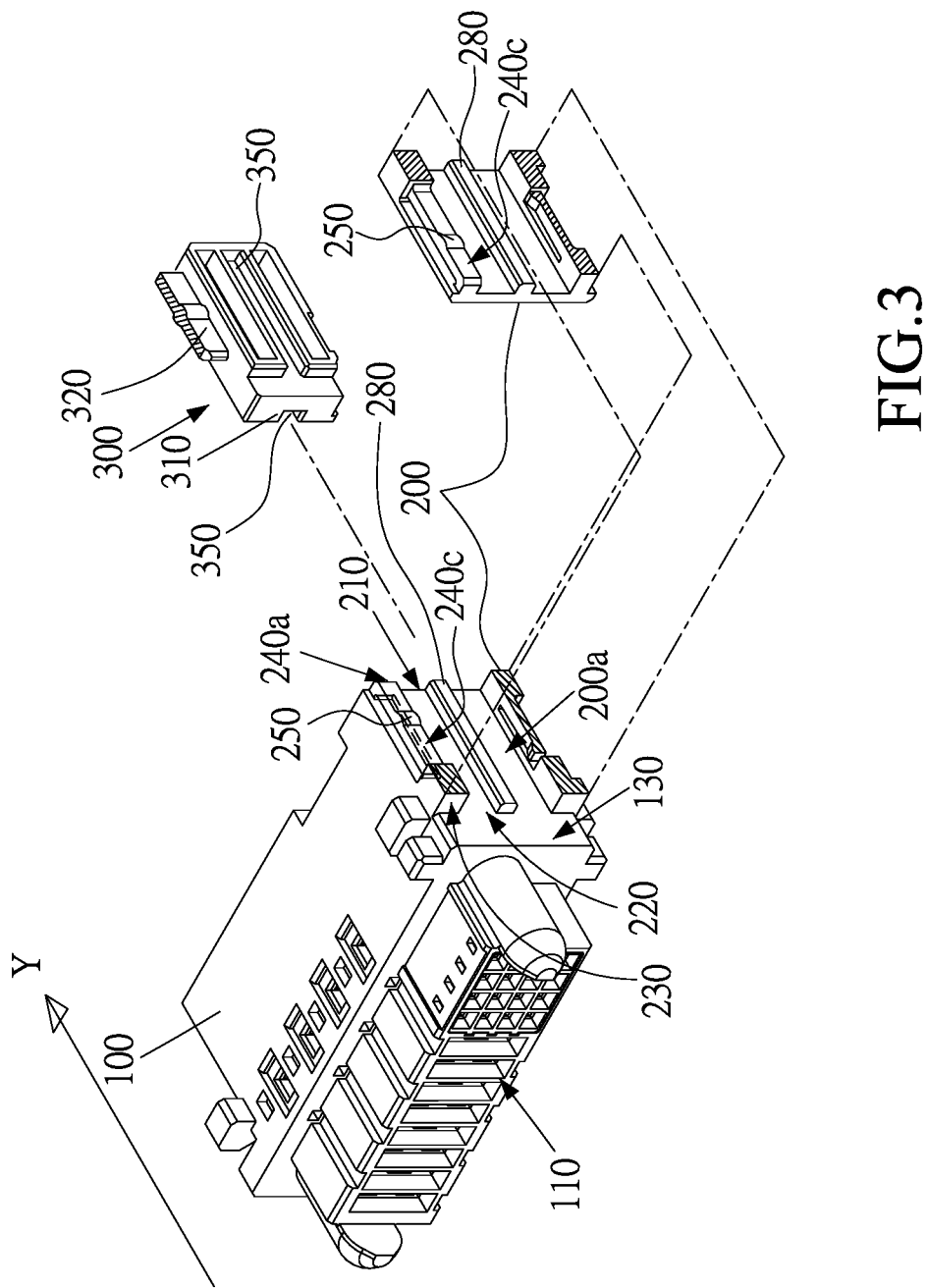
FIG. 3 illustrates an exploded view of the electrical connector of the first embodiment, where a cross-sectional view of a seat of the electrical connector is shown.

As shown in FIGS. 1, 2, and 3, the seat 200 is disposed on the outer peripheral surface 130. In general, the seat 200 and the insulation body 100 are integrally formed as a one piece member by injection molding with plastic materials. The seat 200 includes a tunnel 200a, the tunnel 200a is defined through the seat 200 along a direction parallel to the installation direction Y to form an inlet 210 and an outlet 220, and the outlet 220 and the front surface 110 face the same side. In this embodiment, the outlet 220 includes a stepped segment with respect to the front surface 110 (in other words, the stepped segment is between the outlet 220 and the front surface 110), so that the front surface 110 protrudes along the installation direction Y from a front end surface 230, where the outlet 220 is disposed at the front end surface 230.

Figure 4:
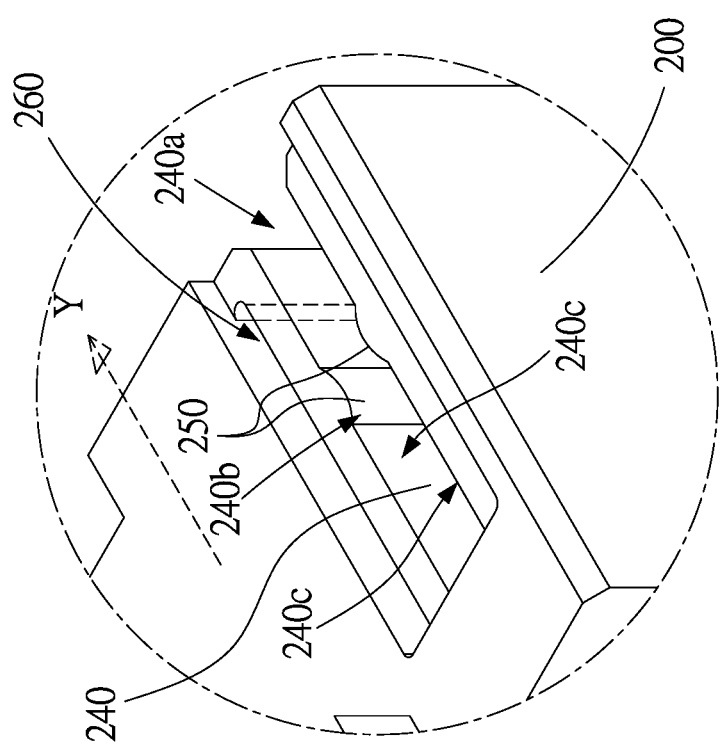
FIG. 4 illustrates a partial perspective view of the seat of the electrical connector of the first embodiment.

As shown in FIGS. 1, 3 and 4, the seat 200 further includes a slit 240 extending in a direction parallel to the installation direction Y. The slit 240 communicates with the tunnel 200a and forms an opening 240a at an edge of the inlet 210. The seat 200 also includes at least one first bump 250, the at least one first bump 250 is disposed on an inner wall 240c of the slit 240 and forms a necking portion 240b in the slit 240.

Figure 5:
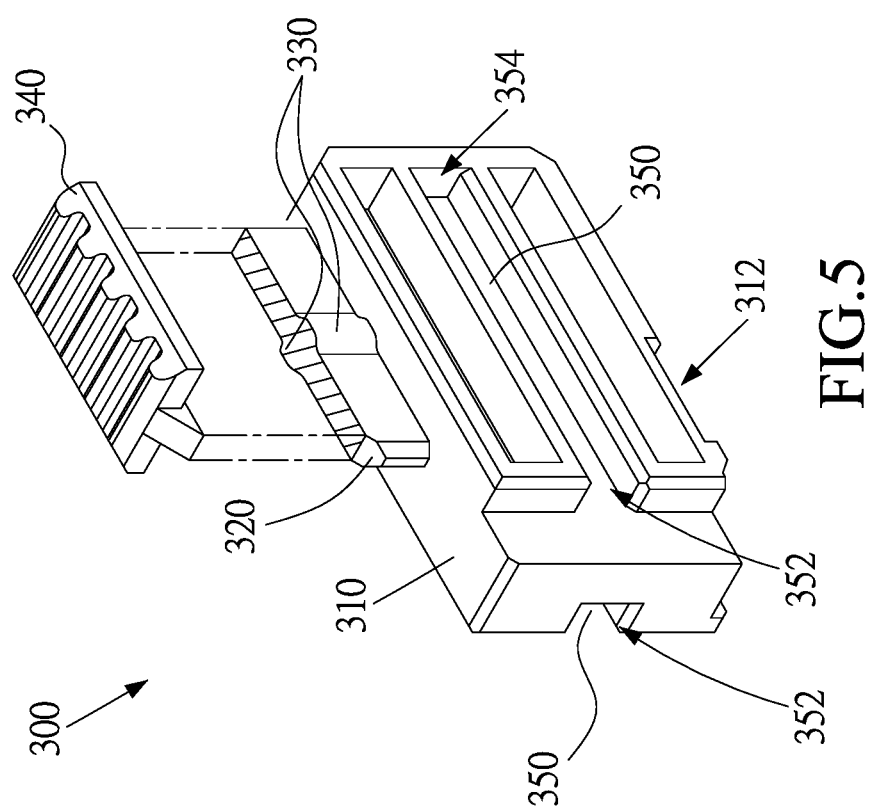
FIG. 5 illustrates a perspective view of a positioning plug of the electrical connector of the first embodiment, where a cross-sectional view of the positioning plug of the electrical connector is shown.

As shown in FIGS. 1, 2, and 5, the positioning plug 300 includes a sliding block 310 and a rib 320, and the rib 320 is connected to the sliding block 310. In this embodiment, the sliding block 310 is movably disposed in the tunnel 200a via the inlet 210, so that the rib 320 is movably disposed in the slit 240. In this embodiment, the positioning plug 300 further includes at least one second bump 330 disposed on a lateral side of the rib 320 facing the at least one first bump 250. The first bump 250 may be arranged in pairs and respectively arranged at two opposite edges of the slit 240, thereby forming the necking portion 240b. The number of the second bumps 330 may also be two respectively arranged at two sides of the rib 320 and correspond to the two first bumps 250.

Figure 6:
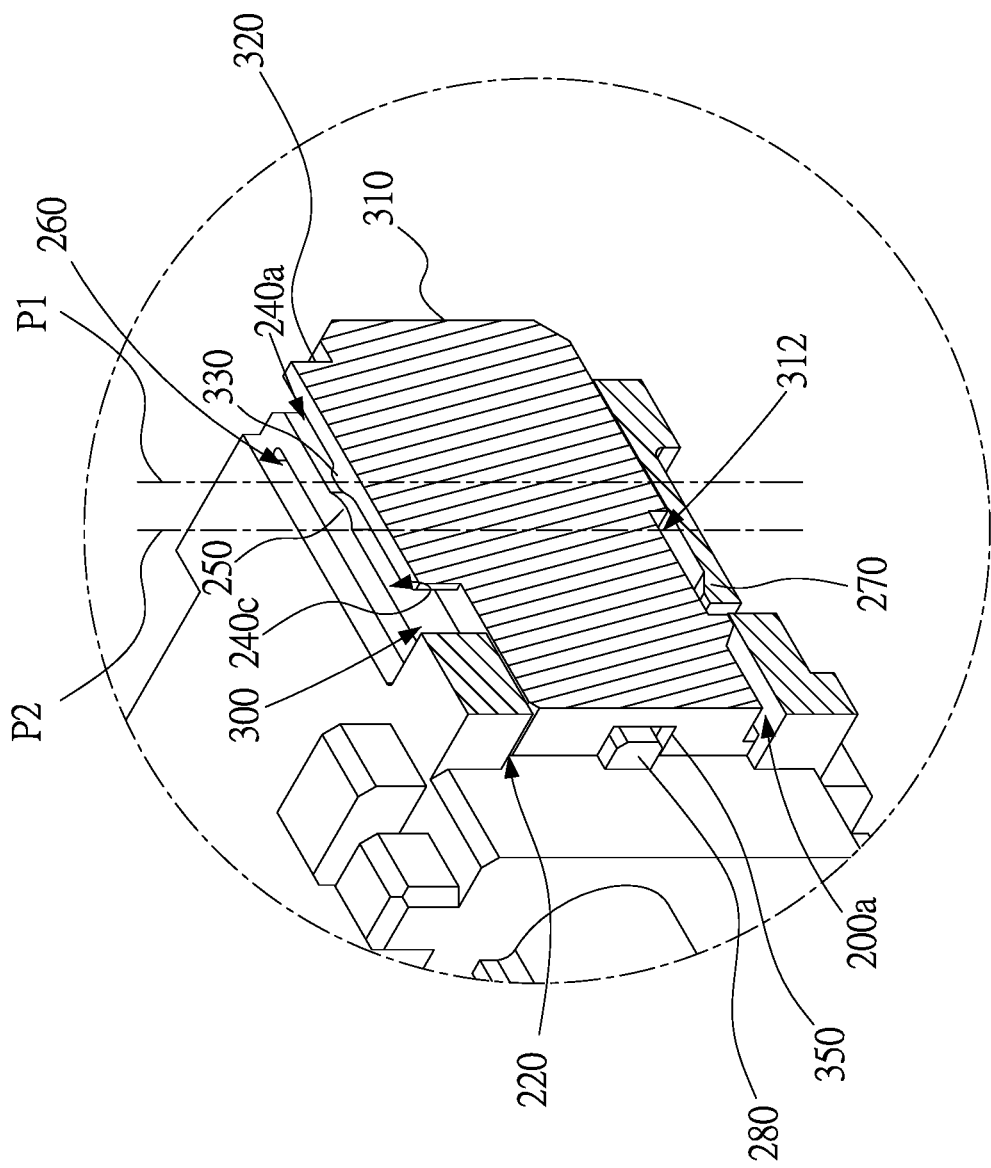
FIGS. 6 and 7 illustrate partial perspective views of the seat and the positioning plug of the electrical connector of the first embodiment, where cross-sectional views of the seat and the positioning plug of the electrical connector are shown.
Figure 7:
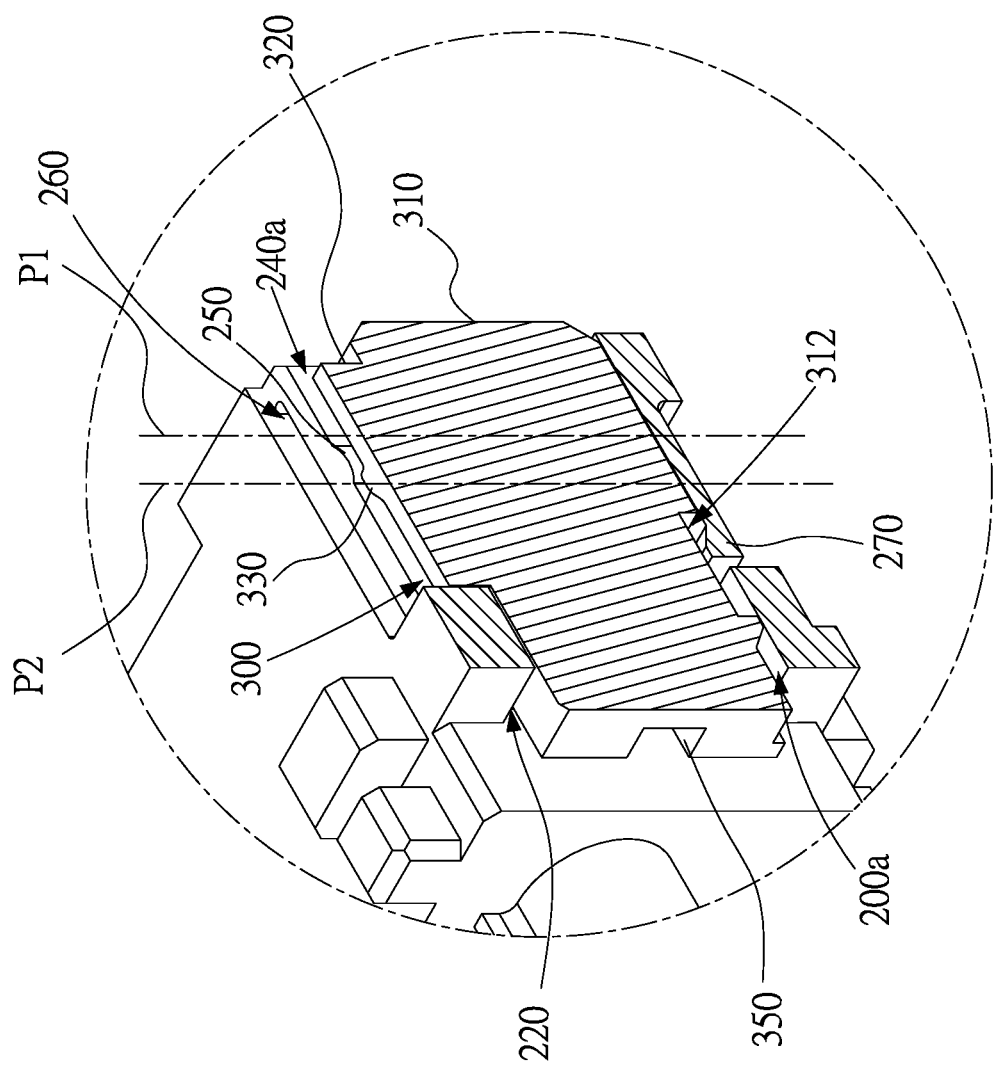

As shown in FIGS. 6 and 7, the sliding block 310 is movably disposed between a released position P1 and an installation position P2 in the tunnel 200a. When the sliding block 310 is disposed at the released position P1, the second bump 330 is located between the first bump 250 and the opening 240a of the slit 240, and the sliding block 310 does not protrude from the outlet 220. When the sliding block 310 is disposed at the installation position P2, the first bump 250 is located between the second bump 330 and the opening 240a of the slit 240, so that the first bump 250 stops the second bump 330 from moving toward the opening 240a, so as to fix the sliding block 310 at the installation position P2 with the sliding block 310 protruding from the outlet 220.

As shown in FIG. 5, a top edge of the rib 320 further includes an operation portion 340. The operation portion 340 is provided with a non-slip pattern for a user to apply force thereon, and the operation portion 340 is adapted to push the sliding block 310 from the released position P1 to the installation position P2.

During the movement of the sliding block 310, the second bump 330 forces the seat 200 and at least a portion of an edge of the slit 240 deform elastically, so that the first bump 250 is displaced from its original position and then moved resiliently after the second bump passes through the original position of the first bump 250. The displaceable and resilient movement of the first bump 250 provides a positioning sensation for a user, so that the user can confirm that the sliding block 310 is arrived at the installation position P2 through the tactile sensation, and the stop of the first bump 250 also can maintain the sliding block 310 at the installation position P2 and protruding from the outlet 220.

As shown in FIGS. 4, 6 and 7, in order to allow at least a portion of the edge of the slit 240 of the seat 200 to deform easily, the seat 200 further includes at least one deformable slot 260 configured parallel to the slit 240, so that at least a portion of the edge of the slit 240 of the seat 200 forms an elastic piece structure, which can deform easily. When the first bumps 250 are arranged in pairs, the number of the deformable slots 260 may be two and respectively located at two sides of the slit 240.

As shown in FIGS. 5, 6, and 7, in order to prevent the sliding block 310 from being detached off the inlet 210; the seat 200 further includes a positioning buckle 270 in the tunnel 200*a*. The sliding block 310 further includes a positioning trough 312 corresponding to the positioning buckle 270. When the sliding block 310 is inserted into the tunnel 200*a* from the inlet 210 to the released position P1, the positioning buckle 270 is engaged into the positioning trough 312, and the positioning buckle 270 moves back-and-forth in the positioning trough 312. A length of the positioning trough 312 is equal to or greater than a length from the released position P1 to the installation position P2. Therefore, the sliding block 310 can be limited to move between the released position P1 and the installation position P2 without being detached off the inlet 210. Therefore, the positioning plug 300 and the insulation body 100 may be combined as a single component, thereby decreasing the risk of having the positioning buckle 270 falling off.

As shown in FIGS. 3, 5 and 6, in order to guide the sliding block 310 moving in the tunnel 200*a*, the seat 200 further includes at least one first guiding element 280 disposed in the tunnel 200*a*. The sliding block 310 further includes at least one second guiding element 350. The first guiding element 280 is mated with the second guiding element 350, so as to limit the sliding block 310 moving from the released position P1 to the installation position P2 along a straight line. In the first embodiment, the first guiding element 280 is a guiding rail arranged in the tunnel 220*a* and extending from the inlet 210 to the outlet 220. It is understood that, when the guiding rail is served as the first guiding element 280, the guiding rail may be also configured as segments discontinuously disposed in the tunnel 200*a*; in other words, in this disclosure, the guiding rail is not limited to be extending continuously from the inlet 210 to the outlet 220. The second guiding element 350 is a guiding groove to receive the guiding rail. The guiding groove includes an open end 352 and a closed end 354, and the open end 352 faces the outlet 220. When the sliding block 310 is disposed at the installation position P2, the guiding rail is abutted against the closed end 354, so that the sliding block 310 cannot move forward.

Please refer to FIGS. 3 and 5 again. In the first embodiment, the seat 200 further includes two first guiding elements 280 respectively disposed at two side walls in the tunnel 200*a*. The sliding block 310 further includes two second guiding elements 350 respectively disposed at two opposite side surfaces of the sliding block 310. Each of the first guiding elements 280 is mated with one corresponding second guiding element 350, so as to limit the sliding block 310 moving from the released position P1 to the installation position P2 along a straight line.

Figure 8:
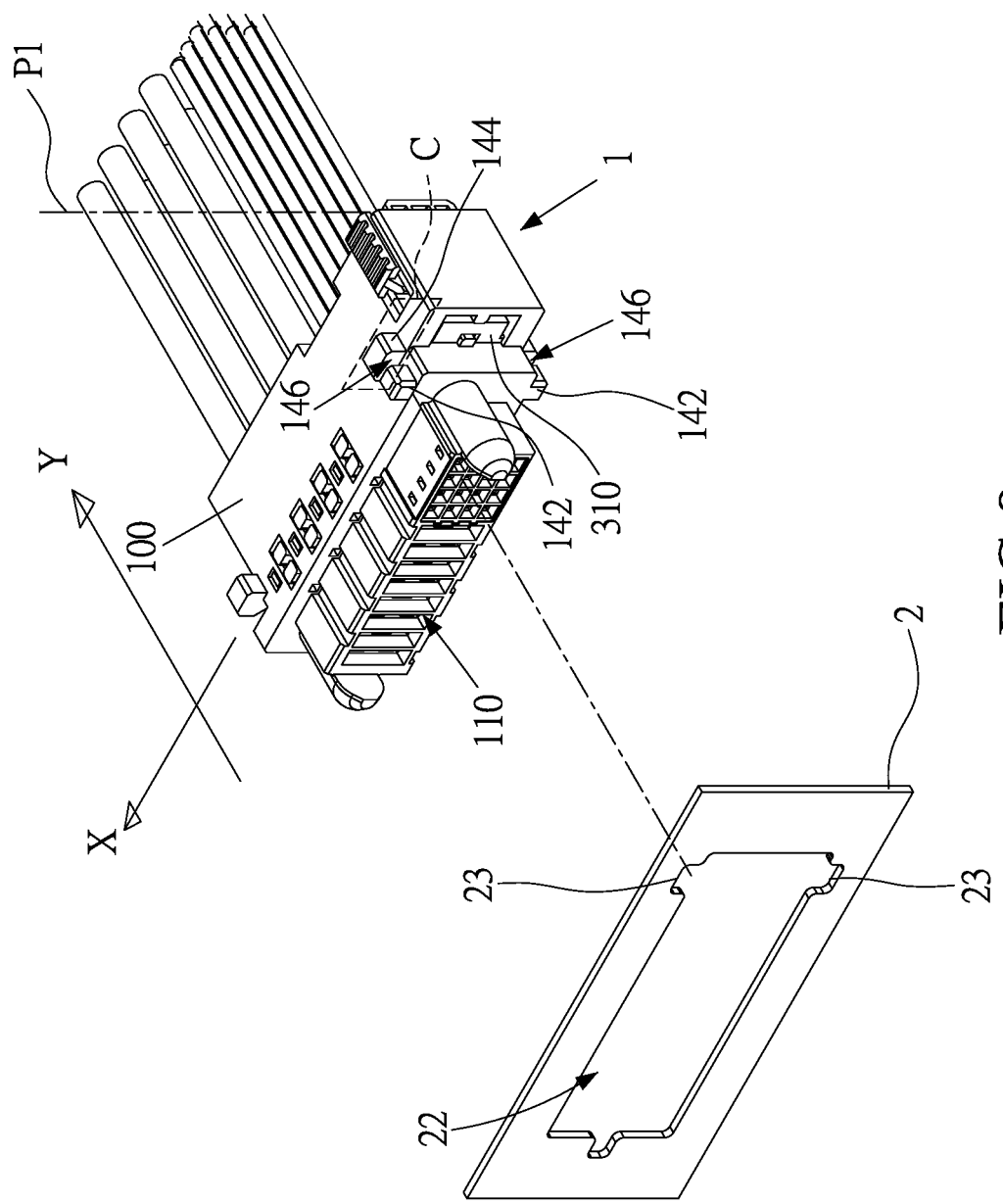
FIG. 8 illustrates an exploded view of an electrical connector assembly of the first embodiment.

Please refer to FIG. 8. A connector assembly according to a first embodiment of this disclosure is illustrated. The connector assembly comprises the electrical connector 1 and a back plate 2. The back plate 2 includes an installation hole 22, and the installation hole 22 can just allow the front surface 110 and portions of the sliding block 310 protruding from the opening 240*a* passing therethrough. The electrical connector 1 assembly is fixed along a horizontal direction X; the horizontal direction X is perpendicular to the installation direction Y.

As shown in FIG. 8, the insulation body 100 further includes at least one front positioning block 142 and at least one rear positioning block 144, a clamping groove 146 is defined between the front positioning block 142 and the rear positioning block 144. A hypothetical clamping plane C where the clamping groove 146 is disposed is perpendicular to the installation direction Y, and the hypothetical clamping plane C is between the front surface 110 and the front end surface 230. The back plate 2 further includes a notch 23 formed at an edge of the installation hole 22, and the notch 23 allows the front positioning block 142 passing therethrough, so that the insulation body 100 can move along the installation direction Y to allow the back plate 2 located at the hypothetical clamping plane C.

Figure 9:
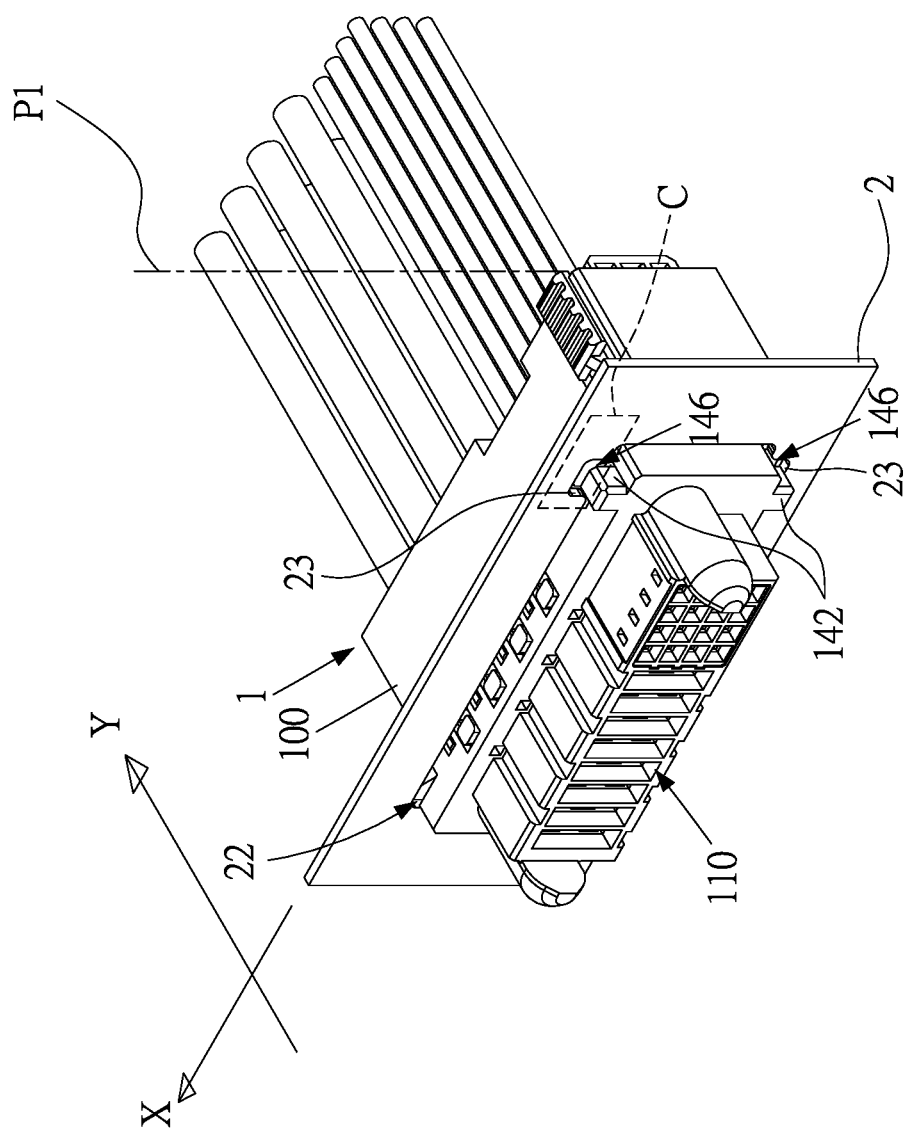
FIGS. 9 to 11 illustrate perspective views of the electrical connector assembly of the first embodiment, and a process demonstrating how the electrical connector is positioned is shown.

As shown in FIGS. 6, 8 and 9, when the electrical connector 1 is connected to the back plate 2, the sliding block 310 of the positioning plug 300 is located at the released position P1, so that the sliding block 310 is not arranged across the hypothetical clamping plane C. At this time, the front surface 110 of the insulation body 100 faces the installation hole 22, and the front positioning block 142 is aligned with the notch 23, thus the front surface 110 and the front positioning block 142 can pass through the installation hole 22 and the notch 23. Therefore, the back plate 2 can be located at the hypothetical clamping plane C where the clamping groove 146 is located.

Figure 10:
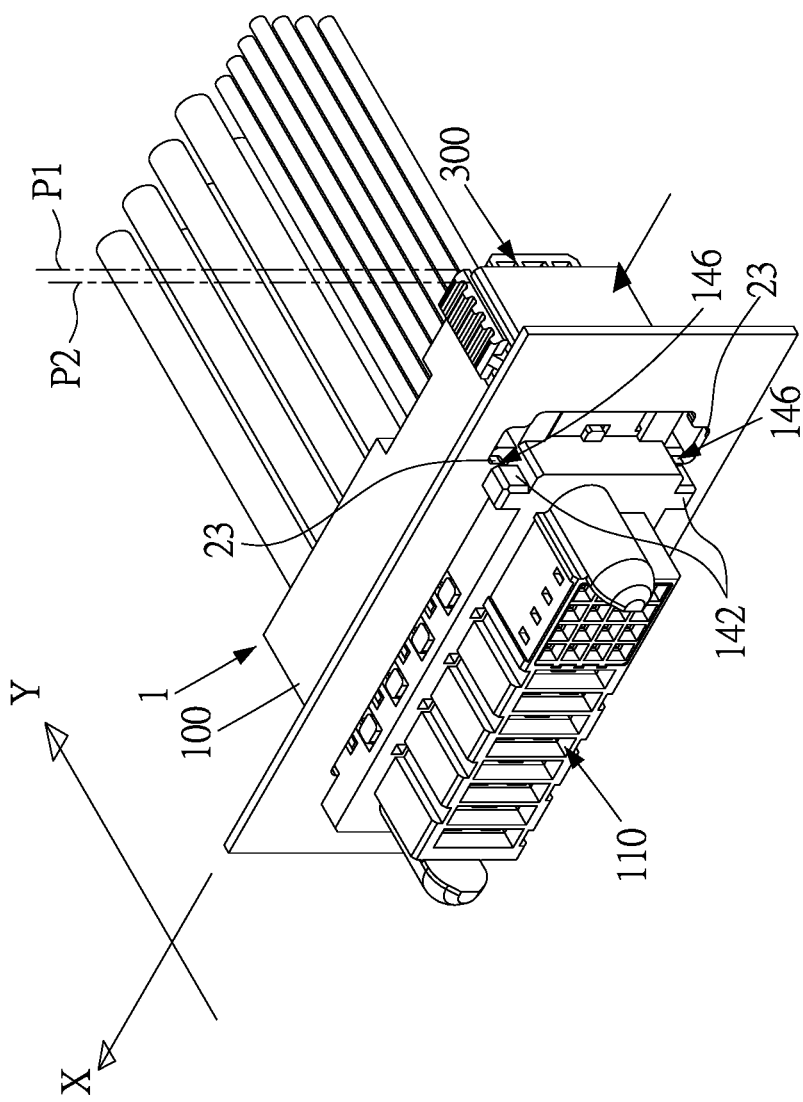

As shown in FIG. 10, next, the insulation body 100 is further moved along the horizontal direction X, so that the front positioning block 142 and the rear positioning block 144 clamp the back plate 2. Therefore, the insulation body 100 is fixed along the installation direction Y.

Figure 11:
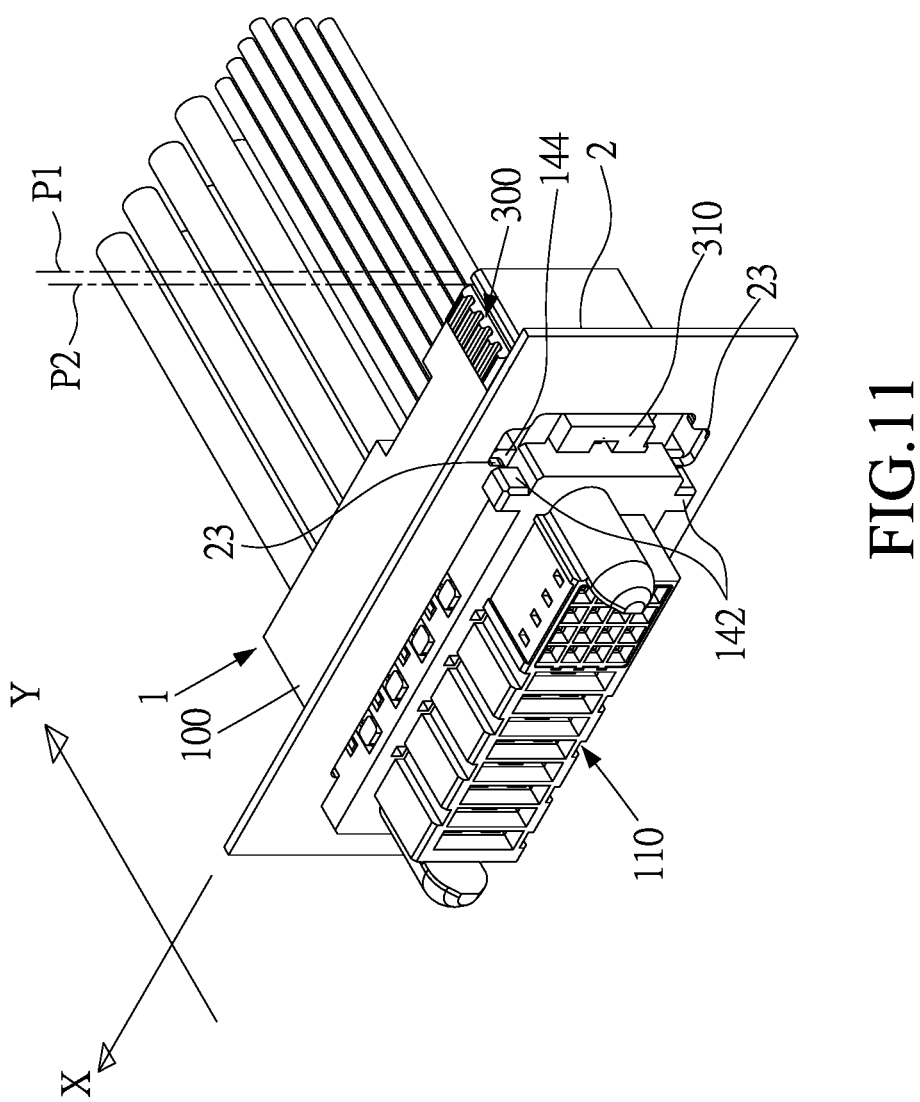

As shown in FIG. 11, finally, the sliding block 310 of the positioning plug 300 is pushed to be located at the installation position P2. Hence, the sliding block 310 is disposed in the installation hole 22, the sliding block 310 is arranged across the hypothetical clamping plane C, and the sliding block 310 is abutted against the edge of the installation hole 22. Therefore, the insulation body 100 cannot move along the horizontal direction X in a reverse direction, thereby achieving the installation of the insulation body 100.

As shown in FIG. 8, in the first embodiment, when the sliding block 310 of the positioning plug 300 is disposed at the released position P1, the sliding block 310 does not protrude from the outlet 220. Therefore, when the front surface 110 of the insulation body 100 passes through the installation hole 22, the movement of the insulation body 100 is not be interfered by the sliding block 310, and the back plate 2 can be positioned at the hypothetical clamping plane C where the clamping groove 146 is located. When the sliding block 310 is at the released position P1, whether the sliding block 310 protrudes from the outlet 220 or not depends on the length of the stepped segment between the outlet 220 and the front surface 110; in other words, in this disclosure, the sliding block 310 is not limited to be not protruding from the outlet 220.

Figure 12:
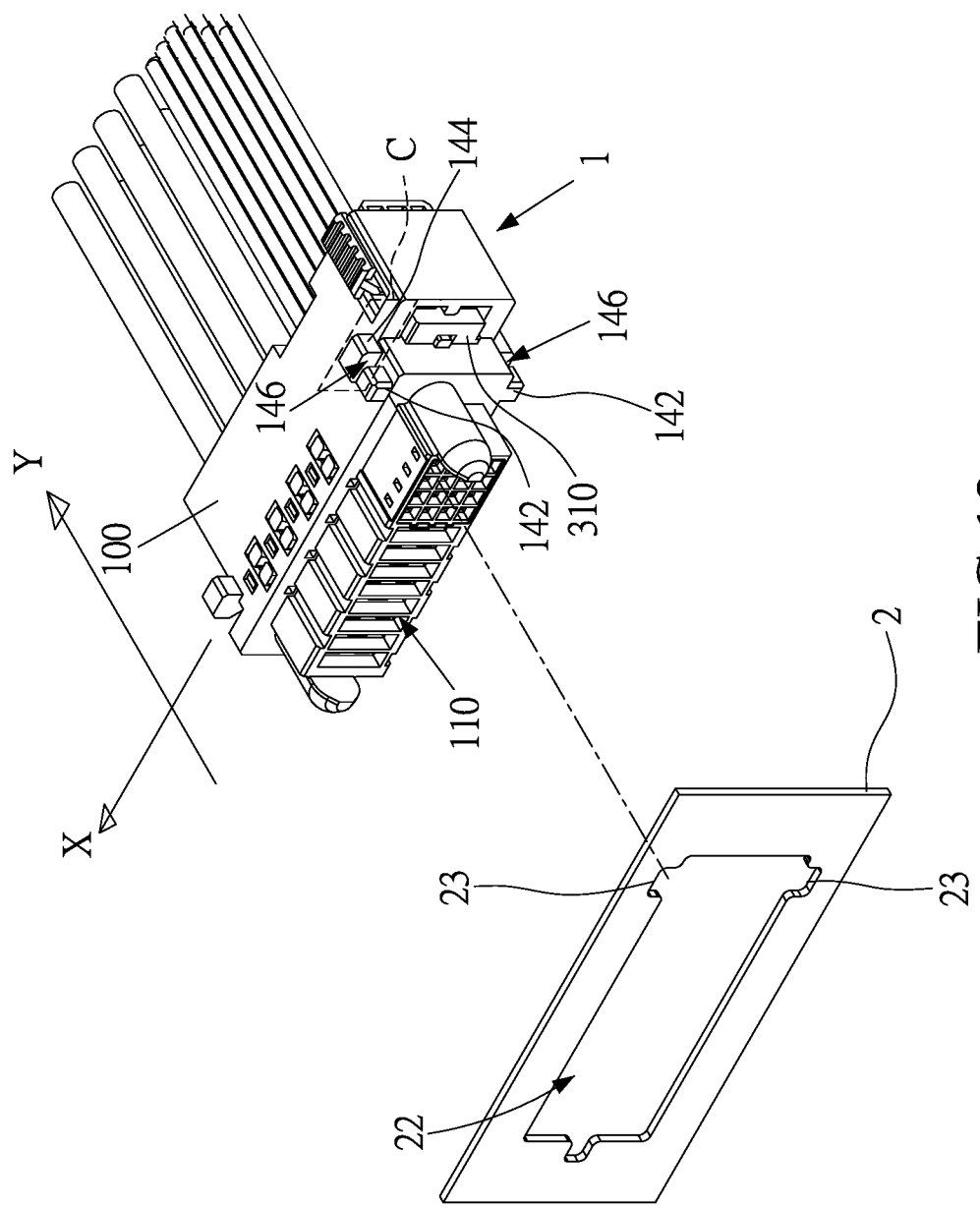
FIG. 12 illustrates an exploded view of the electrical connector assembly according to a second embodiment of this disclosure.

As shown in FIG. 12, a connector assembly according to a second embodiment of this disclosure is illustrated. The connector assembly of the second embodiment is similar to that of the first embodiment, one of the differences is that, the length of the stepped segment between the outlet 220 and the front surface 110 in the second embodiment is great than the length of the stepped segment in the second embodiment. When the sliding block 310 of the positioning plug 300 is disposed at the released position P1, portions of the sliding block 310 are at the outlet 220 and the portions of the sliding block 310 at the outlet 220 and the outlet 220 is not arranged across the hypothetical clamping plane C. That is, according to one or some embodiments of this disclosure, when the sliding block 310 of the positioning plug 300 is disposed at the released position P1, the sliding block 310 and the hypothetical clamping plane C are not at the same plane.

In one or some embodiments of this disclosure, the electrical connector is provided with the positioning plug 300, so that the electrical connector 1 can be rapidly positioned on the back plate 2 without fixing elements such as screws, nuts, pins and other fixings component which may require tool assistances, thereby effectively simplifying and accelerating the assembly process.

What is claimed is:

1. An electrical connector, comprising:
    an insulation body, including a front surface, a rear surface, and an outer peripheral surface, wherein the front surface and the rear surface are correspondingly configured along an installation direction, and the outer peripheral surface is connected to an edge of the front surface and an edge of the rear surface;
    a seat, disposed on the outer peripheral surface, wherein the seat includes a tunnel, the tunnel is defined through the seat along a direction in parallel to the installation direction to form an inlet and an outlet, and the outlet and the front surface face the same side; the seat further includes a slit and at least one first bump, the slit is extending in a direction parallel to the installation direction, the slit communicates with the tunnel, and the at least one first bump is disposed on an inner wall of the slit; the seat further includes at least one deformable slot, and the at least one deformable slot is configured parallel to the slit; and
    a positioning plug, including a sliding block and a rib, wherein the rib is connected to the sliding block; the sliding block is movably disposed in the tunnel via the inlet, so that the rib is movably disposed in the slit; the positioning plug further includes at least one second bump, the at least one second bump is disposed on a lateral side of the rib facing the at least one first bump; wherein the sliding block moves between a released position and an installation position in the tunnel; when the sliding block is disposed at the installation position, the at least one first bump stops the at least one second bump to fix the sliding block at the installation position.

2. The electrical connector as claimed in claim 1, wherein the outlet includes a stepped segment with respect to the front surface, so that the front surface protrudes along the installation direction from a front end surface, where the outlet is disposed at the front end surface.

3. The electrical connector as claimed in claim 1, wherein the slit forms an opening at an edge of the inlet.

4. The electrical connector as claimed in claim 3, wherein when the sliding block is disposed at the installation position, the at least one first bump is located between the at least one second bump and the opening of the slit.

5. The electrical connector as claimed in claim 4, wherein when the sliding block is disposed at the released position, the at least one second bump is located between the at least one first bump and the opening of the slit.

6. The electrical connector as claimed in claim 1, wherein the seat further includes a positioning buckle in the tunnel, the sliding block further includes a positioning trough corresponding to the positioning buckle, the positioning buckle is engaged into the positioning trough, and the positioning buckle moves back-and-forth in the positioning trough.

7. The electrical connector as claimed in claim 6, wherein a length of the positioning trough is equal to or greater than a length from the released position to the installation position.

8. The electrical connector as claimed in claim 1, wherein the seat further includes at least one first guiding element, the sliding block further includes at least one second guiding element, and the at least one first guiding element is mated with the at least one second guiding element, so as to limit the sliding block moving from the released position to the installation position along a straight line.

9. The electrical connector as claimed in claim 8, wherein the at least one first guiding element is a guiding rail arranged in the tunnel, the at least one second guiding element is a guiding groove to receive the guiding rail; the guiding groove includes an open end and a closed end, and the open end faces the outlet.

10. The electrical connector as claimed in claim 1, further comprising at least one electrical terminal and at least one wire, wherein the electrical terminal is disposed in the insulation body, and the electrical terminal is connected to the wire at the rear surface.

11. An connector assembly, comprising:
    the electrical connector according to claim 1; and
    a back plate, including an installation hole, wherein the installation hole allows the front surface and portions of the sliding block protruding from the outlet passing therethrough.

12. The electrical connector assembly as claimed in claim 11, wherein the insulation body further includes at least one front positioning block and at least one rear positioning block; a clamping groove is defined between the at least one front positioning block and the at least one rear positioning block, a hypothetical clamping plane where the clamping groove is located is perpendicular to the installation direction, and the hypothetical clamping plane is between the front surface and the front surface; the back plate further includes at least one notch, the at least one notch is formed at an edge of the installation hole and allows the front positioning block passing therethrough.

* * * * *